United States Patent
Shrestha et al.

(10) Patent No.: US 10,119,839 B2
(45) Date of Patent: Nov. 6, 2018

(54) SENSOR CIRCUIT AND METHOD

(71) Applicant: NXP B.V., Eindhoven (NL)

(72) Inventors: Rameswor Shrestha, Eindhoven (NL);
Franciscus Widdershoven, Eindhoven (NL)

(73) Assignee: NXP B.V., Eindhoven (NL)

(*) Notice: Subject to any disclaimer, the term of this patent is extended or adjusted under 35 U.S.C. 154(b) by 173 days.

(21) Appl. No.: 15/135,533

(22) Filed: Apr. 21, 2016

(65) Prior Publication Data
US 2017/0023382 A1 Jan. 26, 2017

(30) Foreign Application Priority Data
Apr. 23, 2015 (EP) .................................... 15164816

(51) Int. Cl.
*G01R 27/26* (2006.01)
*G01D 5/24* (2006.01)
(Continued)

(52) U.S. Cl.
CPC ........... *G01D 5/24* (2013.01); *G01R 27/2605* (2013.01); *G06F 3/044* (2013.01);
(Continued)

(58) Field of Classification Search
CPC ...... G01D 5/24; G01R 27/2605; G06F 3/044; H03K 17/9622; H03K 17/955; H03K 17/962; H03K 2217/960725
(Continued)

(56) References Cited

U.S. PATENT DOCUMENTS

| 2004/0051396 A1* | 3/2004 | Supper ............... G01R 27/2605 307/129 |
| 2008/0061858 A1* | 3/2008 | Cao ......................... H03F 3/005 327/337 |

(Continued)

FOREIGN PATENT DOCUMENTS

| EP | 2 819 049 A1 | 12/2014 |
| WO | 2006/133082 A1 | 12/2006 |

OTHER PUBLICATIONS

Extended European Search Report for Patent Appln. No. 15164816.9 (dated Oct. 19, 2015).

(Continued)

*Primary Examiner* — Jeff Natalini
*Assistant Examiner* — Steven Yeninas

(57) ABSTRACT

A sensor circuit and method. The circuit includes a first subcircuit that includes a first sense capacitor, a first integration capacitor, and a first clock input for receiving a first digital clock signal for initiating discharge of the first integration capacitor at time T. The circuit includes a second subcircuit that includes a second sense capacitor, a second integration capacitor, and a second clock input for receiving a second digital clock signal for initiating discharge of the second integration capacitor at time $T+T_d$. A rate of discharge of the first and second integration capacitors is at least partly determined by a capacitance of the first and second sense capacitor, respectively. At time $T_{eval}$, after initiation of discharge of the first and second sense capacitors, the extent to which the first and second integration capacitors have discharged is compared. A digital signal indicating the result of the comparison is outputted.

20 Claims, 6 Drawing Sheets

(51) Int. Cl.
*G06F 3/044* (2006.01)
*H03K 17/96* (2006.01)

(52) U.S. Cl.
CPC ............... *H03K 17/9622* (2013.01); *H03K 2217/96074* (2013.01); *H03K 2217/960725* (2013.01); *H03K 2217/960745* (2013.01)

(58) Field of Classification Search
USPC ......... 324/658, 677, 678, 679, 686; 327/337
See application file for complete search history.

(56) References Cited

U.S. PATENT DOCUMENTS

| | | | |
|---|---|---|---|
| 2011/0068810 A1 | 3/2011 | Yeates et al. | |
| 2013/0169340 A1 | 7/2013 | Tao et al. | |
| 2013/0279717 A1* | 10/2013 | Reimann | H04R 3/02 381/93 |

OTHER PUBLICATIONS

Moon, B-J et al. "A Full-Digital Multi-Channel CMOS Capacitive Sensor", IEEE Asian Solid-State Circuits Conference 2006, pp. 247-250 (Nov. 13, 2006).

* cited by examiner

SENSOR CIRCUIT AND METHOD

CROSS-REFERENCE TO RELATED APPLICATIONS

This application claims the priority under 35 U.S.C. § 119 of European patent application no. 15164816.9, filed on Apr. 23, 2015, the contents of which are incorporated by reference herein.

FIELD OF THE INVENTION

This invention relates to a sensor circuit and method.

BACKGROUND OF THE INVENTION

Capacitive sensing is used in a wide range of applications. These applications include the sensing of substances such as gases, liquids, dusts, volatile substances and humidity. Other applications include pressure sensors, finger-print sensors, sensors for detecting spatial position, sensors for the detection of biomolecules (e.g. for biomarker detection).

In many applications, it is desirable to keep the size of the sensing circuitry as small as possible, so as to reduce costs. This can be a particular challenge in applications that require the use of multiple capacitive sensors on a single chip.

It is desirable to keep the amount of analogue circuitry included in the sensing circuitry to a minimum, so as to increase design flexibility, to improve the reliability of the sensor and to reduce the time to market. For instance, in case of some applications that include multiple capacitive sensors (e.g. a two-dimensional sensor array), the use of long wires for passing analogue signals from the sensors can degrade the integrity of the signals and can reduce sensitivity.

Various circuit topologies have been proposed for capacitance sensing. These generally include either analogue inputs/outputs, which require the use of long wires for passing analogue signals, which can degrade the quality of the sensed signal as noted above, or provide a digital implementation with poor sensitivity.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a sensor circuit. The sensor circuit includes a first subcircuit. The first subcircuit includes a first sense capacitor. The first subcircuit also includes a first integration capacitor. The first subcircuit further includes a first clock input for receiving a first digital clock signal for initiating discharge of the first integration capacitor at time T. A rate of discharge of the first integration capacitor is at least partly determined by a capacitance of the first sense capacitor. The sensor circuit also includes a second subcircuit. The second subcircuit includes a second sense capacitor. The second subcircuit also includes a second integration capacitor. The second subcircuit further includes a second clock input for receiving a second digital clock signal for initiating discharge of the second integration capacitor at time $T+T_d$. A rate of discharge of the second integration capacitor is at least partly determined by a capacitance of the second sense capacitor. The sensor circuit is operable, at time $T_{eval}$, after initiation of discharge of the first and second integration capacitors, to compare the extent to which the first and second integration capacitors have discharged, thereby to compare the capacitance of the first sense capacitor to the capacitance of the second sense capacitor. The sensor circuit is also operable to output a digital signal indicating the result of the comparison.

According to another aspect of the invention, there is provided a method for comparing the capacitance of a first sense capacitor to the capacitance of a second sense capacitor of a sensor circuit. The method includes using a first digital clock signal to initiate, at time T, discharge of a first integration capacitor. A rate of discharge of the first integration capacitor is at least partly determined by the capacitance of the first sense capacitor. The method also includes using a second digital clock signal to initiate, at time $T+T_d$, discharge of a second integration capacitor. A rate of discharge of the second integration capacitor is at least partly determined by the capacitance of the second sense capacitor. The method further includes, at time $T_{eval}$, after initiation of discharge of the first and second integration capacitors, comparing the extent to which the first and second integration capacitors have discharged, thereby to compare the capacitance of the first sense capacitor to the capacitance of the second sense capacitor. The method also includes outputting a digital signal indicating the result of the comparison.

Embodiments of this invention may allow accurate capacitance sensing to be implemented in a manner that uses digital clock inputs and a digital output signal. Since the inputs and output of the sensor circuit are digital, the number of analogue signals used can be reduced. For instance, the outputted digital signal may be passed along relatively long wires in a chip without suffering from signal degradation in the way that an analogue signal may be (e.g. due to crosstalk or attenuation).

In one embodiment, the first integration capacitor may include a first decoupling capacitor connected to discharge through a first node of the first subcircuit, and the second integration capacitor may include a second decoupling capacitor connected to discharge through a second node of the second subcircuit. Comparison of the voltages at the nodes may be used to determine the relative extents to which the decoupling capacitors have discharged. The sensor circuit may further include a latch having inputs connected to the nodes. The latch may be operable to set or reset according to the voltage at the first node compared to the voltage at the second node. The latch may thus perform the comparison of the extent to which the first and second decoupling capacitors have discharged. The result of the comparison may be indicative of the relative capacitances of the first and second sense capacitors. The outputted digital signal may thus be indicative of which of the first sense capacitor and the second sense capacitor has the largest capacitance. The latch may store the result of the comparison for subsequent output as the digital signal.

The latch may include a pair of cross-coupled field effect transistors, wherein a first of said transistors has a gate connected to the first node and wherein a second of said transistors has a gate connected to the second node. In some examples, as the voltages at the nodes drop to a level at which the transistors of the latch begin to turn on, the first of the cross-coupled transistors to actually switch on may cause the other transistor to switch off, so that the result of the comparison of the voltages at the nodes of the subcircuit is latched in.

The subcircuits may each include an inverter. Each inverter may have an input for receiving the digital clock signal for that subcircuit. Each inverter may also have an output that is connected to the sense capacitor of that subcircuit. Each integration capacitor may be connected to a power supply input of the inverter of that subcircuit. Accordingly, in such an arrangement, the rate of discharge of the integration capacitors may be determined by the capacitive loads of the inverters, as determined, at least in part, by the sense capacitors.

The inverters may include transmission gates, to allow the integration capacitors to discharge completely.

One of the sense capacitors may be a reference capacitor for sensing a reference capacitance to be compared to the capacitance of the other sense capacitor. This may allow measurements of the absolute value of the other sense capacitor to be made, by comparing the capacitance of the other sense capacitor to the capacitance of the reference capacitor. In some applications, it may be sufficient to compare the ratios of the sense capacitors, so that a reference capacitance may not be needed.

In some embodiments, a plurality of measurements may be made for comparing the capacitance of the first sense capacitor to the capacitance of the second sense capacitor. In each measurement, a different value of $T_d$ may be used. A delay generator may be provided for varying $T_d$. In some examples, the $T_d$ may be varied at least until a change in the outputted digital signal is observed.

Logic may be provided to receive the digital signal indicating the result of the comparison from the output of the circuit. The logic may control the delay generator for varying $T_d$. The logic may convert the results of the measurements into a digital word. The digital word may, for instance, indicate the absolute value of the capacitance of one of the sense capacitors (e.g. where the other sense capacitor is a reference capacitance). The logic may, for example, be successive approximation logic.

In accordance with a further aspect of the invention, there is provided a sensor array including a plurality of sensor circuits of the kind described above. The array may be operable to detect changes in the capacitance of the sense capacitors, for use in applications such as finger-print sensors, sensors for detecting spatial position, sensors for the detection of biomolecules (e.g. for biomarker detection), and sensors for intrusion detection on security chips.

In accordance with another aspect of the invention, there can be provided a secure integrated circuit including a sensor array of the kind described above. The sense capacitors may be distributed at various positions within the secure integrated circuit. The sensor circuits of the array may be operable to detect a change in capacitance in their sense capacitors associated with a tampering of the integrated circuit.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Figure 1:
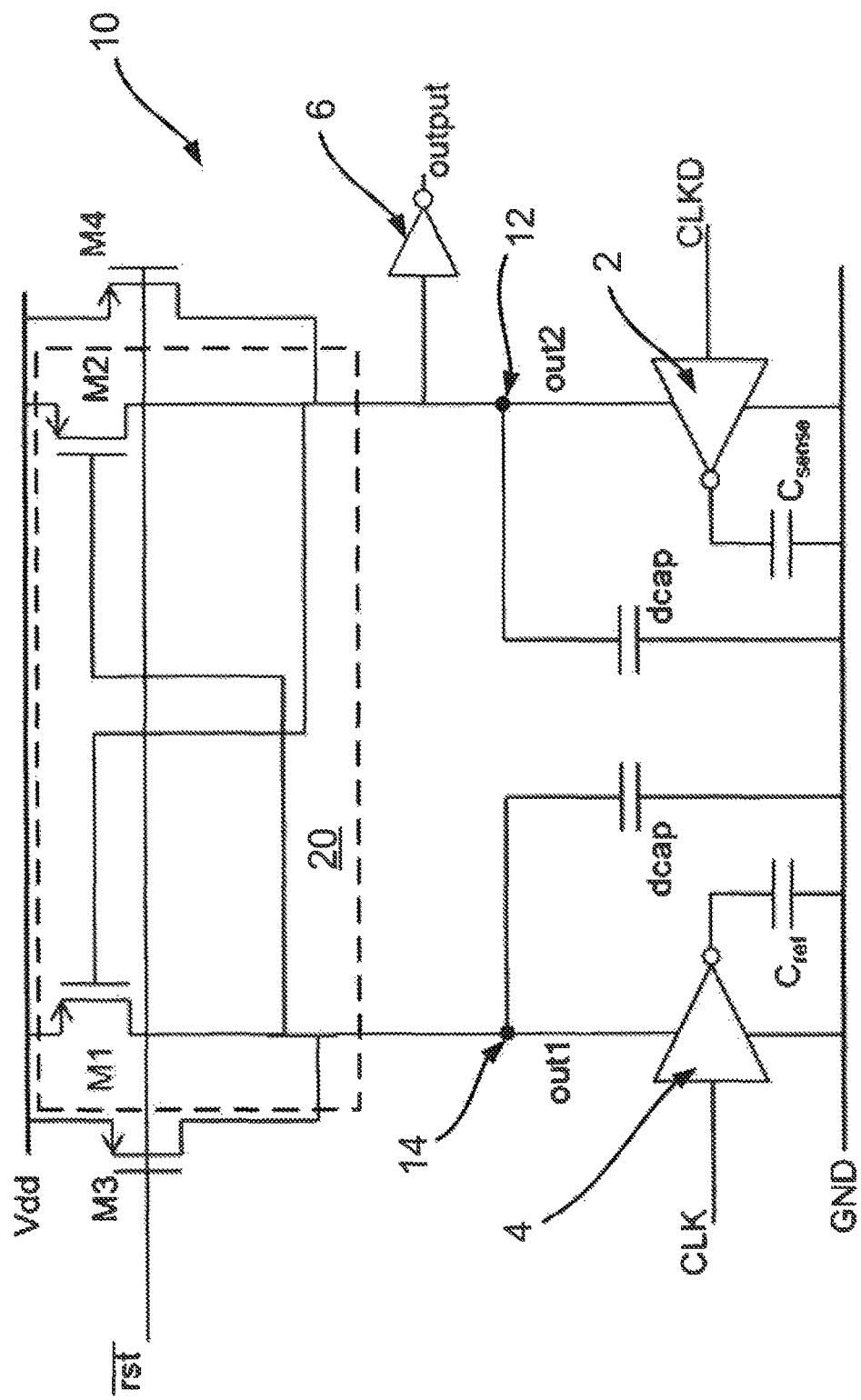
FIG. 1 shows a sensor circuit in accordance with an embodiment of the invention.

Embodiments of the present invention are described in the following with reference to the accompanying drawings.

Embodiments of this invention can provide a sensor circuit. In the embodiments described below in relation to FIGS. 1-5, sensor circuits are described that allow the capacitance of a sense capacitor to be determined relative to that of another sense capacitor. This may allow the ratio of the capacitances of the two sense capacitors to be determined. In some embodiments, the absolute value of the capacitance of the sense capacitors is not known. In some examples however, one of the sense capacitors may be a reference capacitor having a known capacitance. This may allow the absolute value of the other sense capacitor to be determined, for instance by evaluating the ratio the two capacitances.

In the examples of FIGS. 1 to 5, the circuit includes a single pair of sense capacitors. However, it is envisaged that in other embodiments, a plurality of pairs of sense capacitors may be provided. Each pair can form a sensor in a larger array comprising a plurality of such sensors. For instance, it is envisaged that a circuit having many hundreds or even thousands of pairs of sense capacitors may be provided. FIG. 6 described below relates to the provision of a sensor circuit that includes an array of sensors of this kind. Such an array may be used in applications such as finger-print sensors, sensors for detecting spatial position, sensors for the detection of biomolecules (e.g. for biomarker detection), and sensors for intrusion detection on security chips.

In accordance with embodiments of this invention, the sensor circuit includes a first subcircuit and a second subcircuit. Each subcircuit can include components for determining the capacitance of a sense capacitor provided in that subcircuit.

The first subcircuit thus includes a first sense capacitor and a first integration capacitor. The first subcircuit also includes a first clock input for receiving a first digital clock signal for initiating discharge of the first integration capacitor at a time T. A rate of discharge of the first integration capacitor is at least partly determined by a capacitance of the first sense capacitor.

Similarly, the second subcircuit also includes a sense capacitor, an integration capacitor and a clock input. The clock input of the second subcircuit can receive a second digital clock signal for initiating discharge of the second integration capacitor at a time $T+T_d$, where $T_d$ corresponds to a delay between initiation of the discharging of the two integration capacitors of the circuit. A rate of discharge of the second integration capacitor is at least partly determined by a capacitance of the second sense capacitor. Note that $T_d$ may be positive or negative, so that discharge of either the first or the second integration capacitor may initiate first.

Thus, each subcircuit includes a sense capacitor, an integration capacitor and a clock input. As will be described in more detail below, the clock inputs, which can receive a digital clock signal, can cause the integration capacitors to be discharged starting at different points in time (T and $T+T_d$, respectively). Since the rate of discharge is at least partly determined by the capacitance of the sense capacitor of each subcircuit, by comparing, after a certain amount of time, the extent to which the integration capacitors have discharged, the capacitance of the two sense capacitors may be indirectly compared. In the example described below in relation to FIG. 1, the comparison is performed by a latch circuit that latches into one of two states in accordance with a voltage at a node within each subcircuit. The latching of the latch circuit may occur when the voltage at one of the nodes decreases below a switch-on voltage for a PMOS transistor of the latch circuit.

The sensor circuit also includes an output, for outputting a digital signal that indicates the result of the comparison of the capacitance of the first and second sense capacitors. In some examples, the digital signal that is outputted may be determined by the state of the latch circuit.

Since the inputs to the sensor circuit are digital (the inputs include the first digital clock signal and the second digital clock signal) and since the output of the sensor circuit is also digital (for instance, determined according to the state of the latch circuit) the need for analogue inputs and outputs may be reduced. In this way, degradation of signals passing to and from the sensor circuit (in the case of analogue inputs and outputs) may be avoided.

In some embodiments, a plurality of measurements can be made, where the time delay $T_d$ may be altered for each measurement. In this way, the value of $T_d$ that leads to a change in the result outputted by the sensor circuit may be determined. Where the time delay $T_d$ between the initiation of discharge of the two integration capacitors is, for example zero, it may be expected that the amount of discharge of the integration capacitors at evaluation time may be determined entirely by the capacitances of the first and second sense capacitors. However, a non-zero time delay $T_d$ is introduced (e.g. so that the second integration capacitor starts to discharge later than the first integration capacitor), the first integration capacitor may discharge to a greater extent that the second integration capacitor (since it has a greater time available for discharge than the second integration capacitor), even if the first sense capacitor has a smaller capacitance than the second sense capacitor. By performing a number of repeated measurements, varying $T_d$ in each measurement, a determination can be made as to the amount of time delay that is required to cause the two integration capacitors to discharge by equal amounts, and this amount of time delay is related to the relative capacitances of the first and second sense capacitors. Thus, by determining the amount of time delay required to change the result of the comparison performed by the sensor circuit, information about the capacitances of the two sense capacitors of the sensor circuit can be determined.

FIG. 1 shows a sensor circuit 10 in accordance with a first embodiment of this invention. The circuit 10 includes two power rails. A first power rail is held at first voltage $V_{dd}$ while a second power rail is held at a second voltage, which in the example of FIG. 1 is ground (GND).

The circuit 10 includes a first subcircuit that includes a clock input (CLK) that is connected to an input of an inverter 4. As will be described in more detail below, the inverter 4 may include a pair of transistors, in particular a PMOS transistor connected to an NMOS transistor. An output of the inverter 4 is connected to a terminal of the first sense capacitor, which in the present embodiment is a reference capacitor $C_{ref}$ having a known capacitance. The reference capacitor $C_{ref}$ is also connected at its other terminal to the ground rail GND. The inverter 4 has power supply inputs that are connected to a node 14 of the first subcircuit and the ground rail GND. The first subcircuit further includes a decoupling capacitor (dcap) having a first terminal that is connected the node 14 and a second terminal that is connected to the ground rail GND.

The circuit in FIG. 1 also includes a second subcircuit. The second subcircuit is configured similarly to the first subcircuit. For instance, the second subcircuit also includes an inverter 2 having an input connected to receive a digital clock signal (CLKD) and an output connected to a first terminal of a sense capacitor $C_{sense}$. A second terminal of the sense capacitor $C_{sense}$ is connected to the ground rail GND. The inverter 2 has power supply inputs that are connected to a node 12 of the first subcircuit and the ground rail GND. The second subcircuit also includes a decoupling capacitor (dcap) having a first terminal that is connected the node 12 and a second terminal that is connected to the ground rail GND.

In some embodiments, the circuit of FIG. 1 can be used to determine the ratio of capacitances of the sense capacitor of the first subcircuit and the sense capacitor of the second subcircuit. In the present embodiment, the sense capacitor of the first subcircuit is a reference capacitor as noted above. Accordingly, since the reference capacitor has a known capacitance, the circuit of FIG. 1 may be used to determine an absolute value of the sense capacitor of the second subcircuit by determining the amount of time delay that is required for the results of the comparison of the capacitances of the two sense capacitors to change (i.e. to determine the amount of time delay which is required to overcome any difference in capacitance between the two sense capacitors as determined by the latch circuit described below).

The circuit 10 shown in FIG. 1 also includes an output which may be connected to an inverter 6. In this embodiment, the input of the inverter 6 is connected to the node 12 of the second subcircuit. To provide a balanced circuit, an inverter may also be connected to the node 14 of the first subcircuit, although this inverter may not be used in practice.

In this embodiment, the circuit 10 includes a latch 20, the components of which are shown within the dashed box in FIG. 1. The latch 20 includes a pair of PMOS transistors M1 and M2. The transistors M1 and M2 are cross-coupled. In particular, the gate of M1 is connected to the drain of M2, and the gate of M2 is connected to the drain of M1. The source of M1 and the source of M2 are both connected to the power rail $V_{dd}$. The drain of M1 is also connected to the node 14 of the first subcircuit, while the drain of M2 is also connected to the node 12 of the second subcircuit. The operation of the transistors M1 and M2 will be described in more detail below.

The circuit 10 in FIG. 1 may further include transistors M3 and M4, which may be PMOS transistors. These transistors may be provided to allow resetting of the circuit 10. The source of M3 is connected to the power rail $V_{dd}$ and the drain of M3 is connected to the node 14 of the first subcircuit. The source of the transistor M4 is also connected to the power rail $V_{dd}$ and the drain of the transistor M4 is connected to the node 12 of the second subcircuit. The gate of each transistor M3 and M4 is connected to receive a reset signal.

The operation of the circuit 10 shown in FIG. 1 will now be described.

As noted previously, the sense capacitors $C_{ref}$ and $C_{sense}$ are connected between the outputs of the inverters 4, 2 and the ground rail GND. The dynamic current consumptions of the inverters 4, 2 are proportional to their respective capacitive loads, as determined by the capacitances of the sense capacitors $C_{ref}$ and $C_{sense}$.

At the beginning of each measurement, the reset switches formed by the PMOS transistors M3 and M4 are closed (logic value of reset signal=1). Accordingly, the voltages at the nodes 14 and 12 are equal to the supply voltage from the power rail $V_{dd}$. At a time $T_{reset}$, the reset switches provided by M3 and M4 are opened (logic value of reset signal=0). At this time, or shortly after, the inverter 4 begins to switch in accordance with the digital clock input CLK. As the inverter 4 begins to switch, discharging of an integration capacitor of a first subcircuit is initiated.

The integration capacitor of the first subcircuit in this example is formed by the decoupling capacitor dcap of the first subcircuit in parallel with the gate capacitance of the transistor M2. Similarly, the integration capacitor of the second subcircuit in this example is formed by the decoupling capacitor dcap of the second subcircuit in parallel with the gate capacitance of the transistor M1. The integration capacitors of the first and second subcircuits may also have small contributions from parasitic capacitances of the components connected to the nodes 14 and 12, respectively.

The discharging of the integration capacitor of the first subcircuit occurs at a rate which is at least partly determined by the capacitance of the reference capacitor $C_{ref}$ in the first subcircuit, since the dynamic current consumption of the inverter 4 is proportional to the capacitive load of the inverter 4, which is determined by the capacitance of the reference capacitor $C_{ref}$.

At a given time after the clock input CLK begins to switch the inverter 4, the clock input CLKD similarly begins to switch the inverter 2 (for the present example, it is assumed that $T_d$ is positive, so that the inverter 4 begins to switch first). In the same way as described above in relation to the operation of the inverter 4, the switching of the inverter 2 initiates discharge of the integration capacitor of the second subcircuit.

The discharging of the integration capacitor of the second subcircuit occurs at a rate which is at least partly determined by the capacitance of the sense capacitor $C_{sense}$ in the second subcircuit, since the dynamic current consumption of the inverter 2 is proportional to the capacitive load of the inverter 2, which is determined by the capacitance of the sense capacitor $C_{sense}$.

As the integration capacitors of each subcircuit discharge, the voltages at the nodes 14 and 12 begin to drop. After a certain amount of time, one of the nodes 14 and 12 will eventually reach a voltage which is low enough to switch on the transistor of the latch 20 (i.e. either M1 or M2) that has its gate connected to that node. By way of example, if the voltage at node 12 drops below the switch-on voltage of the transistor M1, the transistor M1 will switch on. As transistor M1 begins to conduct, the voltage at node 14 of the first subcircuit will begin to return to the voltage at the power rail $V_{dd}$. This increase in voltage at node 14 has the effect of driving up the voltage at the gate of transistor M2, so that the transistor M2 remains switched off. On the other hand, if the voltage at node 14 drops below the switch-on voltage of the transistor M2, then transistor M2 begins to conduct, leading to an increase in the voltage at the node 12 of the second subcircuit and having the effect also of ensuring that transistor M1 remains switched off.

Accordingly, the transistors M1 and M2 operate as a latch. The state of the latch is determined according to which of the nodes 14 and 12 is first to drop below the switch-on voltage of its corresponding PMOS transistor (M2, M1). Thus, by inspecting the state of the latch 20 after it has settled, it is possible to determine which of the two integration capacitors of the circuit 10 has discharged to reach the switch-on voltage of its corresponding transistor in the latch 20 first.

A number of factors may affect the outcome of the race between the two nodes 12, 14 to drop below the switch-on voltage of its corresponding transistor in the latch.

Firstly, and as already noted, the rate of discharge of the integration capacitor is at least partly determined by the capacitance of the sense capacitor of that subcircuit (which may, as already noted, be a reference capacitor). However, it will also be noted that the outcome of the race may also be determined by the length of a delay between initiation of the switching of the inverter 4 of the first subcircuit and initiation of the switching of the inverter 2 of the second subcircuit.

The interplay between these two factors can be exploited to make a comparison between the capacitance of the two sense capacitors. For instance, where the delay is zero, then it may be expected that the subcircuit with the sense capacitor having the largest capacitance would discharge its integration capacitor more quickly, and since both subcircuits have the same amount of time for discharging, it is expected that the subcircuit with the sense capacitor having the largest capacitance would be first to drop below the switch-on voltage of its corresponding transistor in the latch circuit 20. However, when a delay is included in the measurement, this result may be reversed. For instance, it may be that the subcircuit having a sense capacitor with the larger capacitance may still lose the race if the other subcircuit has more time to discharge. In other words, the subcircuit that discharges more slowly may still win the race if it has more time to discharge compared to the other subcircuit. As will be explained in more detail below, the amount of time delay that causes this change in the outcome of the race can yield information about the relative capacitances of the sense capacitors.

The operation of the subcircuits of the sensor circuit of FIG. 1 is described in more detail below in relation to FIGS. 2 and 3.

Figure 2:
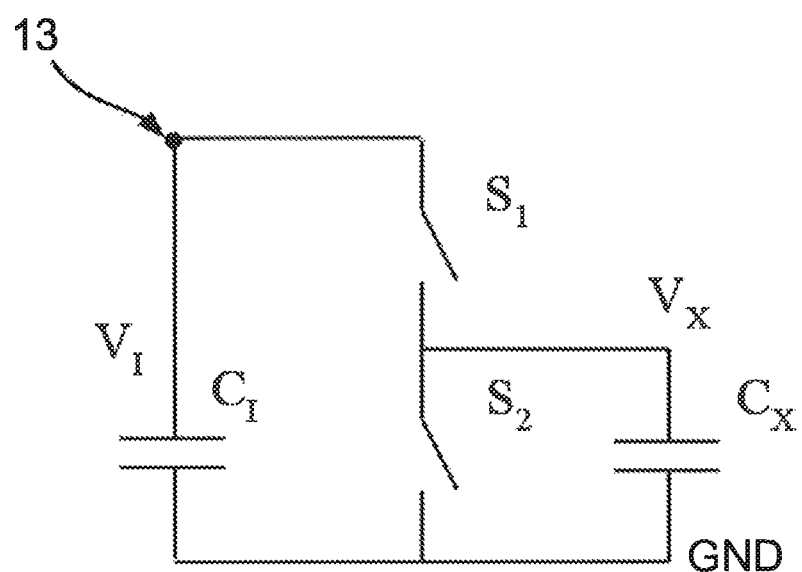
FIG. 2 illustrates the operation of one of the subcircuits of the sensor circuit of FIG. 1 in accordance with an embodiment of the invention.

FIG. 2 shows an example of an equivalent circuit representing the basic principle of operation of one of the subcircuits of a sensor circuit according to an embodiment of the invention. As noted previously, the inverters 2, 4 of each subcircuit in the embodiment of FIG. 1 may include a PMOS transistor and an NMOS transistor. In FIG. 2, the PMOS transistor is represented by the switch $S_1$, while the NMOS transistor is represented by the switch $S_2$.

The capacitor labelled $C_X$ in FIG. 2 represents the sense capacitor of the subcircuit. The capacitor labelled $C_I$ in FIG. 2 represents the integration capacitor of the subcircuit. The integration capacitor can include the decoupling capacitor described relation to FIG. 1, and may also include other contributions as noted above. The node 13 shown in FIG. 2 represents the node of the subcircuit (e.g. either the node 12 or the node 14 in FIG. 1). FIG. 2 also shows a ground rail (GND) of the kind described in relation to in FIG. 1.

The operation of the subcircuit shown in FIG. 2 may include a number of steps as follows:

1. In a first step, the voltage $V_I$ on capacitor $C_I$ is reset to a voltage $V_I(0)$, e.g. using the reset circuit including transistors M3 and M4 as noted above (in the embodiment of FIG. 1, the initial voltage $V_I(0)$ corresponds to $V_{dd}$).
2. In a next step, the switch $S_2$ can be closed. This causes the capacitor $C_X$ to discharge, ($V_X$=0) as both terminals of the capacitor $C_X$ are connected to ground.

3. In a next step, the switch $S_2$ can be opened again (still, $V_X=0$).
4. In a next step, the switch $S_1$ can be closed. This charges the capacitor $C_X$ by transferring charge from the capacitor $C_I$ to the capacitor $C_X$. After the capacitor $C_X$ has been charged, $V_X=V_I$.
5. In a next step, the switch $S_1$ can be opened again (still, $V_X=V_I$).

The operation of the subcircuit can include repetition of steps 2 to 5 indicated above, controlled by the digital clock input received by the inverter of the subcircuit, until the voltage $V_I$ has decreased below a detection threshold voltage $V_D$. The detection threshold $V_D$ may be determined by the switch-on voltage of a transistor (e.g. M1 or M2) of the latch circuit 20 to which node 13 of the subcircuit is connected.

After the $k^{th}$ iteration through steps 2 to 5, the voltage $V_I(k)$ is related to the voltage $V_I(k-1)$ by the charge balance:

$$V_I(k-1)C_I = V_I(k)C_I + V_I(k)C_X \quad \quad 1)$$

Consequently:

$$V_I(k) = \frac{V_I(k-1)}{1+\frac{C_X}{C_I}} = \frac{V_I(0)}{\left(1+\frac{C_X}{C_I}\right)^k} \quad \quad 2)$$

After $k_X$ iterations, $V_I$ eventually reaches the detection threshold voltage $V_D$, so that:

$$V_D = \frac{V_I(0)}{\left(1+\frac{C_X}{C_I}\right)^{k_X}} \quad \quad 3)$$

The number of iterations $k_X$ required to reach the detection threshold voltage is therefore given by:

$$k_X = \frac{\ln\left(\frac{V_I(0)}{V_D}\right)}{\ln\left(1+\frac{C_X}{C_I}\right)} \quad \quad 4)$$

In general, the right-hand-side of equation 4 is an irrational number. To be able to approximate it accurately by the nearest integer $k_X$, with a small relative error, $k_X$ should be much larger than 1.

If it is assumed that for many hardware implementations $V_I(0)$ and $V_D$ are of similar magnitude (e.g. $V_D=0.5\times V_I(0)$), then the numerator ($\ln(V_I(0)/V_D)$) on the right hand side of equation 4 will be of the order of magnitude of 1. It follows that for large $k_X$, the denominator ($\ln(1+C_X/C_I)$) on the right hand side of equation 4 should be small ($0<C_X/C_I\ll 1$). The logarithm in the denominator can be approximated by the first term of its Taylor series:

$$k_X = \frac{C_I}{C_X}\ln\left(\frac{V_I(0)}{V_D}\right) \quad \quad 5)$$

As described in relation to FIG. 1, the capacitance sense circuit includes two subcircuits. Assuming that the other subcircuit also has a sense capacitor $C_Y$ and following equations 1 to 5 above (assuming also that M1 and M2 have the same switch-on voltage $V_D$, and that the integration capacitors of the two subcircuits have equal value), then the number of iterations required for the detection threshold to be reached by the other subcircuit is given by:

$$k_Y = \frac{C_I}{C_Y}\ln\left(\frac{V_I(0)}{V_D}\right) \quad \quad 6)$$

And for the nominal value $C_N$ of the sense capacitors:

$$k_N = \frac{C_I}{C_N}\ln\left(\frac{V_I(0)}{V_D}\right) \quad \quad 7)$$

From equations 5 and 6 it follows that:

$$\frac{C_X}{C_Y} = \frac{k_Y}{k_X} \quad \quad 8)$$

The right-hand-side of equation 8 can be rewritten as:

$$\frac{k_Y}{k_X} = \frac{1-\frac{k_X-k_Y}{k_X+k_Y}}{1+\frac{k_X-k_Y}{k_X+k_Y}} \quad \quad 9)$$

In the most challenging case, where $C_X$ and $C_Y$ are distributed in a narrow region around $C_N$, and therefore $k_X \approx k_Y \approx k_N$, we can approximate the unknown number $k_X+k_Y$ by $2k_N$:

$$\frac{k_Y}{k_X} = \frac{1-\frac{k_X-k_Y}{2k_N}}{1+\frac{k_X-k_Y}{2k_N}} \quad \quad 10)$$

Substitution in equation 8 gives:

$$\frac{C_X}{C_Y} = \frac{1-\frac{k_X-k_Y}{2k_N}}{1+\frac{k_X-k_Y}{2k_N}} \quad \quad 11)$$

Solving $(k_X-k_Y)$ gives:

$$k_X-k_Y = 2k_N\frac{1-\frac{C_X}{C_Y}}{1+\frac{C_X}{C_Y}} \quad \quad 12)$$

The (also unknown) value of $k_N$ may be estimated from circuit design simulations.

In the embodiment of FIG. 1, the crossing of the detection threshold is not determined for each subcircuit separately. Instead, each subcircuit is connected to the latching circuit 20, and the subcircuit that reaches the detection threshold first will "win the race", and thereby determine the state of the latch 20 after settling.

In accordance with an embodiment of the invention, the voltages over the integration capacitors of the first and second subcircuit can be forced to reach the detection threshold voltage $V_D$ at the same moment in time by initiating discharge of the integration capacitor (e.g. commencing the iteration cycle described in relation to steps 1 to 5 above) in each subcircuit at a different point in time. Discharge of a first of the integration capacitors can be initiated at time T, while discharge of the other integration capacitor can be initiated at time $T+T_D$, where $T_D$ is made equal to $k_X-k_Y$ divided by the clock frequency (which in this embodiment is the same for both clocks).

This may be implemented by delaying the clock CLKD with respect to the clock CLK shown in FIG. 1 by a number of cycles $k_D$, where in a one embodiment $k_D$ in general is a rational number. Assuming that $C_X$ and $C_Y$ are connected to the inverters clocked by the clocks CLK and CLKD, respectively, the tripping point where the settled state of that latching circuit flips from 0 to 1, or from 1 to 0, corresponds to a delay given by equation 12.

In one embodiment, this tripping point can be found by scanning the delay $k_D$ in fractional steps of a clock period (the same clock period for the two subcircuits) through a range of values that covers the target range of capacitance ratios $C_X/C_Y$. This fractional stepping can be implemented using digital delay lines, digital dividers, counters or a combination of them (an example of this will be described in more detail below in relation to FIG. 5). Although in this way the delay between CLKD and CLK can be varied in fractions of a clock period, the iteration cycle numbers $k_X$ and $k_Y$ themselves may always be integer values.

However, because the latching circuit may respond slowly (i.e. with a settling time slower than or comparable to a clock period) when an integration capacitor voltage reaches its detection threshold voltage a fractional delay of one clock to the other effectively translates into a variation of dwell time of the integration capacitance voltage near the detection threshold voltage. This way, fractional delay steps can be used to determine the latch circuit's tripping point accurately. If the latch circuit's settled state flips at a fractional delay of $k_T$ clock cycles, then the capacitance ratio of the two sense capacitors may be estimated by substituting $k_T$ for $k_X-k_Y$ in equation 11:

$$\frac{C_X}{C_Y} = \frac{1-\frac{k_T}{2k_N}}{1+\frac{k_T}{2k_N}} \qquad 13)$$

where $k_T$ in general can be positive or negative.

Figure 3:
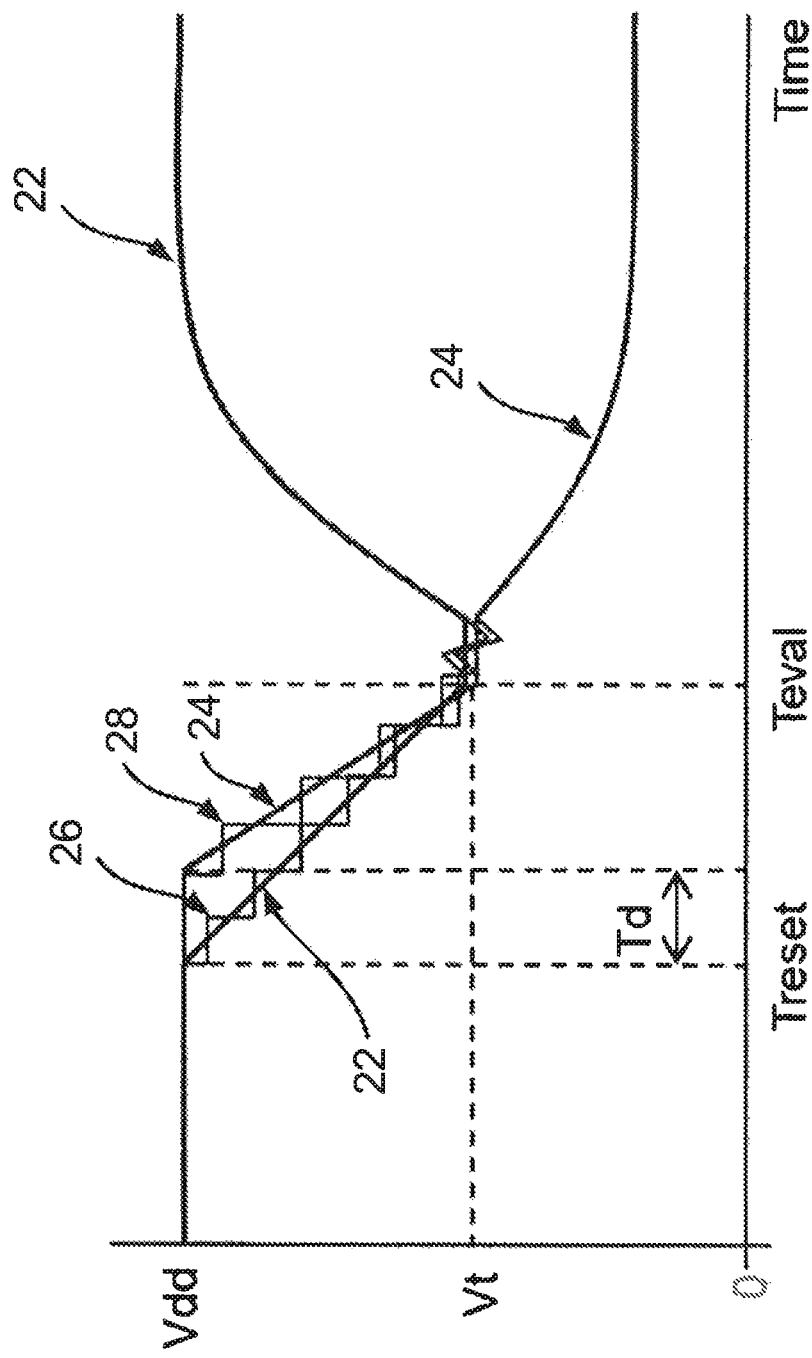
FIG. 3 illustrates waveforms in a sensor circuit in accordance with an embodiment of the invention.

FIG. 3 illustrates the wave forms of the sensor circuit shown in FIG. 1 as a function of time. In particular, the line 22 in FIG. 3 corresponds to the voltage at node 14 of the first subcircuit and the line 24 shows the voltage at the node 12 of the second subcircuit in FIG. 1. In this example, it is assumed that a delay $T_d$ is introduced so that initiation of the discharge of the integration capacitor of the second subcircuit begins later than discharge of the integration capacitor of the first subcircuit (i.e. $T_d$ is positive). It is also assumed that the sense capacitor $C_{sense}$ has a greater capacitance than the sense capacitor $C_{ref}$ in FIG. 1.

In FIG. 3, at time $T_{reset}$ the initially closed transistors M3 and M4 are opened to leave the latch circuit 20 in an initialized state such that the voltages at the nodes 14 and 12 are equal to $V_{dd}$. At $T_{reset}$, the inverter 4 of the first subcircuit begins to switch under the control of the digital clock input CLK. As shown in FIG. 3 (see the line labelled 22), this initiates discharge of the integration capacitor of the first subcircuit such that the voltage at node 14 of the first subcircuit begins to drop. As shown schematically by the line 26 in FIG. 3, the drop in voltage at the node 14 occurs in a number of steps, each step corresponding to a discharge of the integration capacitor by the transfer of charge from the integration capacitor to the sense capacitor $C_{ref}$ as described above in steps 2-5 relating to FIG. 2. Although the discharging of the integration capacitor occurs as a series of steps, this discharging may be approximated by a linear decay (line 22 for node 14), particularly if a large number of iterations are required to discharge the integration capacitors until one of the corresponding transistors of the latch circuit 20 is switched on.

After a delay $T_d$, the inverter 2 of the second subcircuit begins to switch also, under the control of the digital clock input CLKD. As shown by the line labelled 24 in FIG. 3, this initiates discharge of the integration capacitor of the second subcircuit, leading to a drop in voltage at the node 12 of the second subcircuit. Again, and as shown by the line 28 in FIG. 3, the discharge of the integration capacitor of the second subcircuit occurs as a series of steps, although this may be approximated by a linear decay as shown by the line labelled 24.

After the discharge of each integration capacitor has been initiated, they both continue to discharge for a certain amount of time until one of the nodes 14, 12 drops to a voltage that is low enough to switch on either the transistor M2 or the transistor M1, respectively. The time at which a first of the two nodes 14, 12 drops to a sufficiently low voltage is denoted in FIG. 3 as time $T_{eval}$. At this time, and as already explained above, the race to drop to the switch-on voltage of one of the transistors of the latch circuit 20 is won either by the first subcircuit or the second subcircuit and the result is stored by the latch circuit 20.

In the present example, the outcome is that the voltage at node 12 of the second subcircuit is first to drop to the switch-on voltage of its associated latch transistor (namely M1). This switches on transistor M1 so that the voltage at node 14 increases to $V_{dd}$. Since the gate of transistor M2 is connected to node 14 of the first subcircuit, this increase in voltage at node 14 ensures that transistor M2 remains switched off. Accordingly, the voltage at node 12 continues to drop. The increase in voltage at node 14 and the continuing decrease in voltage at node 12 is illustrated in FIG. 3 after time $T_{eval}$. In some examples, it may be that the race is rather close, so that the transistors M1 and M2 may begin to switch on at approximately the same time. This can result in a settling period in the latch circuit 20, during which the outcome of the race is determined as the two transistors M1 and M2 compete to switch on first. This period can be seen in FIG. 3 shortly after time $T_{eval}$ and before the lines 22 and 24 diverge.

FIG. 3 is illustrative in the sense that although the inverter 4 begins to switch first so that the integration capacitor of the first subcircuit begins discharging before the integration circuit of the second subcircuit, the voltage at node 12 of the second sub-circuit still reaches the switch-on voltage of transistor M1 before the voltage at the node 14 reaches the switch-on voltage of the transistor M2. This is because the capacitance of the sense capacitor $C_{sense}$ second subcircuit is larger than the capacitance of the sense capacitor $C_{ref}$ of the first subcircuit (which causes the integration capacitor of the second subcircuit to discharge more quickly). The value of $T_d$ has been chosen for illustrative purposes in FIG. 3 such that the second subcircuit only just manages to win the race to discharge its integration capacitor such that the voltage at the node 12 drops to a level at which M1 is switched on.

FIG. 3 also illustrates that there are only two possible outcomes to the race. Either the voltage at node 12 of the second subcircuit or the voltage at node 14 of the first subcircuit will, after time $T_{eval}$, go to $V_{dd}$ (and the voltage at the other node will continue to decrease). With reference again to FIG. 1, the inverter 6 at the output of the circuit 10 has an input which will either receive voltage $V_{dd}$ or a substantially lower voltage in accordance with the outcome of the race. The output 6 therefore has two possible states and is thus a digital output. Accordingly, signals passing from the circuit 10 along potentially long signal lines in a sensor array need not suffer from the degradation associated with analogue circuitry.

Figure 4:
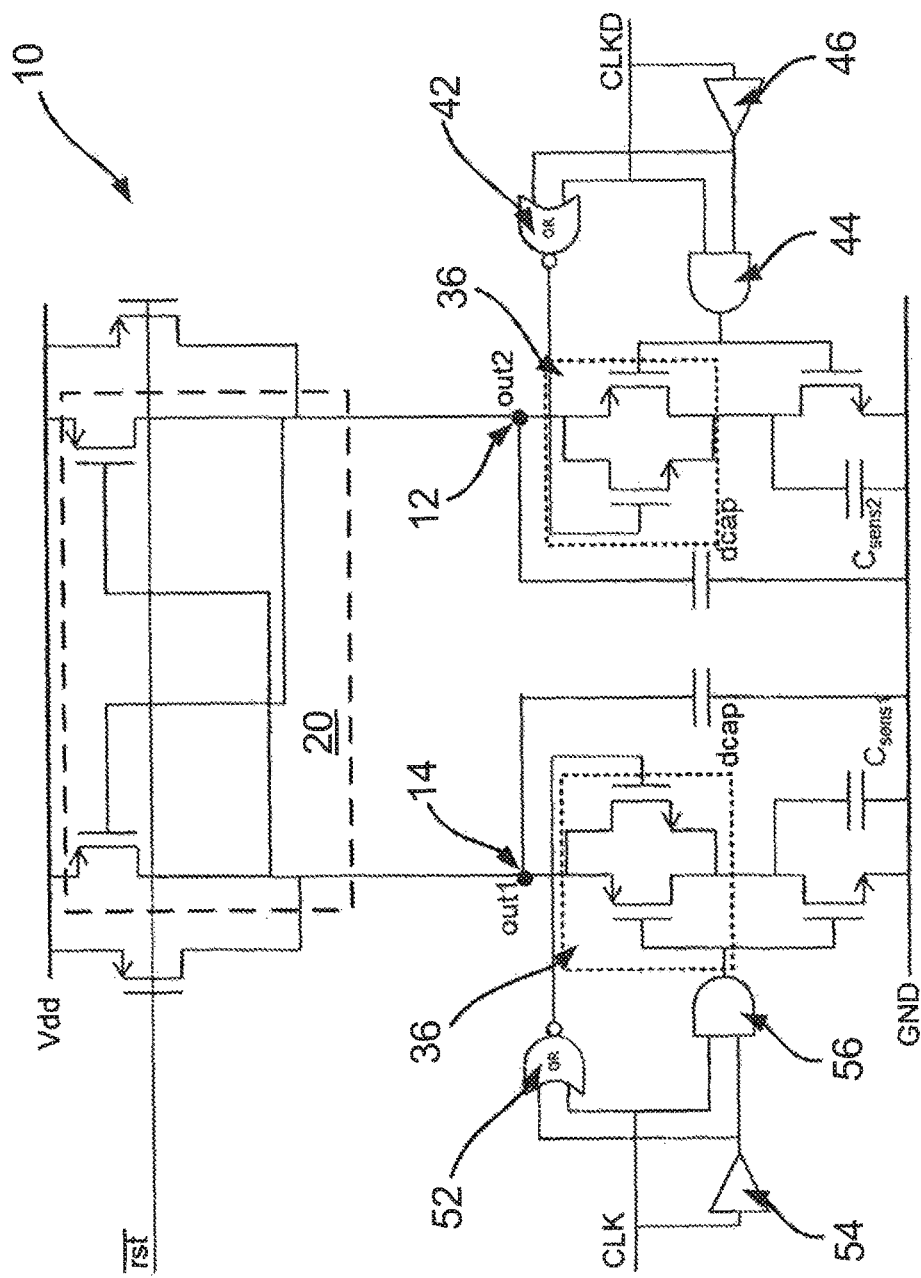
FIG. 4 shows a sensor circuit in accordance with another embodiment of the invention.

FIG. 4 shows a sensor circuit 10 in accordance with another embodiment of this invention. The circuit 10 in this example is similar to that described above in relation to FIG. 1 and only the differences between the two circuits will be described here.

As noted above, the inverters in the embodiment of FIG. 1 may include a PMOS transistor and an NMOS transistor (see also FIG. 2). In the example of FIG. 4, the PMOS transistors of the inverters of the first subcircuit and the second subcircuit are replaced with transmission gates 36. Each transmission gate 36 includes a PMOS transistor and an NMOS transistor connected in parallel. The gates of the transistors of the transmission gate 36 of each subcircuit are connected to the digital clock input of that subcircuit through a number of control gates. For instance, the gates of the transistors of the transmission gate 36 of the first subcircuit are connected to CLK via a NOR gate 52 an AND gate 56 and a buffer 54, while the gates of the transistors of the transmission gate 36 of the second subcircuit are connected to CLKD via a NOR gate 42, and AND gate 44 and a buffer 46. The input of the transmission gate is connected to the node 14, 12 of that subcircuit, while the output of each transmission gate is connected to an NMOS transistor of the inverter of that subcircuit (corresponding to the switch $S_2$ described above in relation to FIG. 2).

The effect of the replacement of the PMOS transistor of the inverter of each subcircuit with a transmission gate is that the voltages at the nodes 14, 12 of the respective subcircuits can go close to ground if required (c.f. the line 24 in FIG. 3, which does not approach zero after time $T_{eval}$). Another effect of the replacement of the PMOS transistor of the inverter of each subcircuit with a transmission gate is that the output voltage of the latch at evaluation time can be made lower than $V_{dd}-V_{tp}$ (where $V_{tp}$ is the (absolute value of the) threshold voltage of the transistors M1 and M2), if required, by adding two PMOS transistors in series with the drains, gates or sources of M1 and M2, to increase the integration time. As long as these series transistors are open, the latch is disabled, and the nodes 14, 12 will continue to be discharged. At the moment that the series transistors are closed (the forced evaluation time) the latch is enabled, and the decision may be made by the latch.

Instead of comparing the sense capacitance with a reference capacitance, the circuit described herein can be used for applications where differential sensing is required. In that case, instead of using a reference capacitor as described in relation to FIG. 1, both sense capacitors can have an unknown capacitance and these two unknown capacitances can then be compared using the methodology described above to determine their ratio.

Figure 5A:
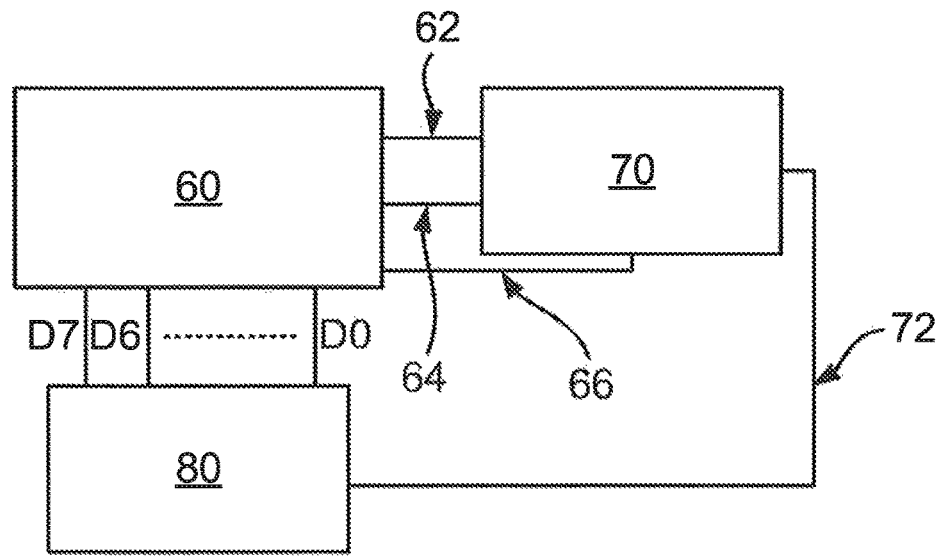
FIG. 5A shows a sensor apparatus in accordance with a further embodiment of the invention.
Figure 5B:
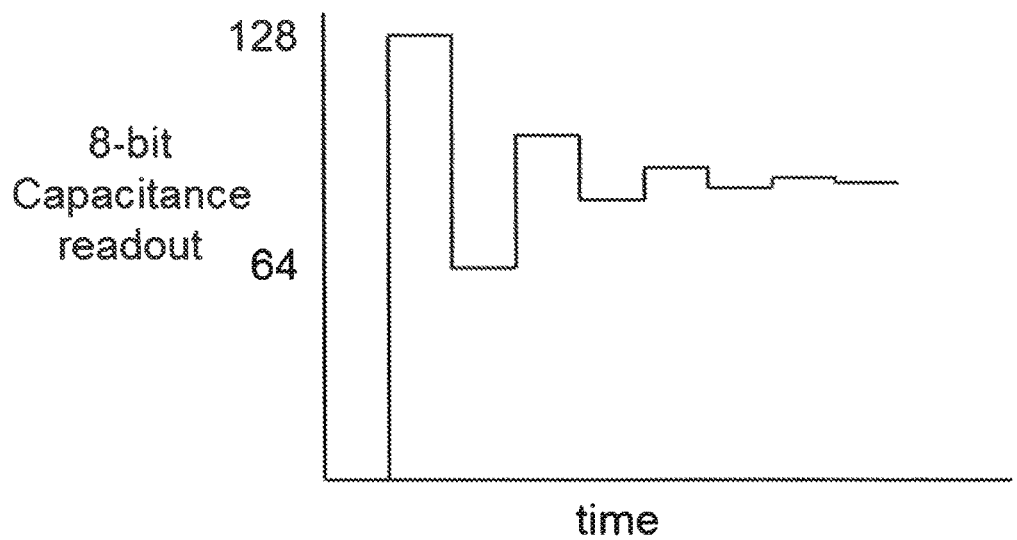
FIG. 5B illustrates an example 8-bit capacitance readout in accordance with an apparatus of the kind shown FIG. 5A.
Figure 6:
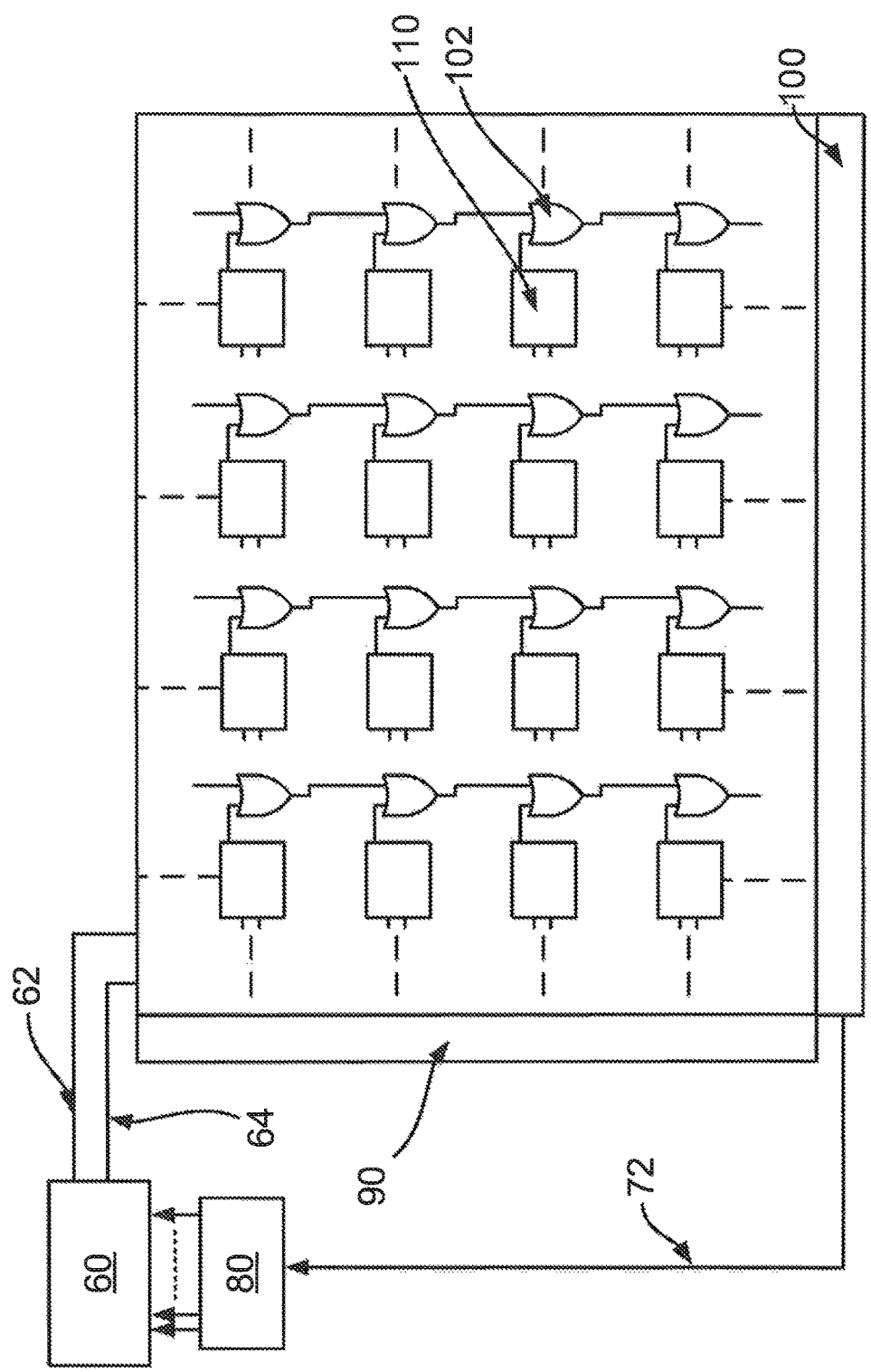
FIG. 6 shows a sensor apparatus in accordance with another embodiment of the invention.

FIGS. 5A and 5B illustrate a capacitance sense circuit and the operation of such a circuit in accordance with a further embodiment of this invention. In this embodiment, the circuit includes a circuit of the kind described above in relation to any of FIGS. 1-4. This circuit is shown schematically by the box labelled 70.

The circuit 70 may be controlled by a programmable delay generator 60. Control lines 62 and 64 can provide digital clock signals CLK and CLKD to the circuit 70 as described above. The programmable delay generator can provide these clock signals including an inbuilt delay which may be varied between measurement iterations. A further control line 66 can be provided to allow the programmable delay generator to provide a reset signal to the transistors M3 and M4 of the circuit of the kind described above in relation to FIGS. 1-4.

The connection labelled 72 in FIG. 5A corresponds to the output of a circuit 70 of the kind described above, which is a digital output as has already been noted. The connection 72 provides the digital output signal corresponding to the outcome of the comparison between the two sense capacitors of the circuit 70 to logic 80. The logic 80 can determine a digital word corresponding to the sensed capacitance values, according to the digital outputs of the circuit 70 in a number of measurement iterations. In the present example, the digital word is an eight bit word labelling 256 consecutive fractional delay steps from low (negative) to high (positive), as explained above, although it is envisaged that any alternative number of bits may be used.

The operation of the circuits shown in FIG. 5A will now be described with reference also to FIG. 5B, which shows the eight bit capacitance readout of the logic 80 shown in FIG. 5A (i.e. the numerical value of the digital word with binary representation D7D6D5D4D3D2D1D0) as a function of time.

In the present example, the logic 80 comprises successive approximation logic, although it is envisaged that any other suitable logic for constructing a digital word from the digital signals outputted by the circuit 70 may be used. Where the logic 80 comprises successive approximation logic, an illustrative approach in which each bit of the eight bit capacitance readout is set either to zero or to one in accordance with the output of the circuit 70 may be followed.

For instance, in a first measurement conducted by the circuit of FIG. 5A, the programmable delay generator supplies a pair of clock signals along the control lines 62 and 64 with a delay between them that is set according to a value of the eight bit capacitance readout equal to 128. In this example, this results in the output on line 72 being a logic low. In a next iteration, the programmable delay generator can halve the amount of delay between the signals on lines 62 and 64 (such that the delay corresponds to a value of 64 in the eight bit capacitance readout). In this example, this results in the output of the sensor cell 70 being logic high (since the change in delay has led to a different one of the subcircuits winning the race described above). In a next iteration, since the output of the sensor cell 70 was previously logic high, the programmable delay generator 60 can again increase the delay to a value intermediate the values used in the first and second iterations, further to evaluate the output of the sensor cell. This process can be repeated until each bit of the eight bit word associated with the capacitance readout D0, . . . D6, D7 shown in FIG. 5A has been completed. The resulting digital word, arrived at by successive approximation led by the output of the circuit 70, provides an indication of the amount of delay that would cause the race conducted by the subcircuits to be drawn, or at least very nearly drawn.

The value of the digital word is indicative of, for instance, the ratio of the capacitances of the sense capacitors of the subcircuits of the sensor cell 70. For instance, the time delay corresponding to the digital word determined using the successive approximation algorithm noted above, may be used in conjunction with equation 12 shown above to determine the ratio of the capacitances. Where one of the sense capacitors is a reference capacitor having a known value, the digital word can further be used to determine an absolute value of the capacitance of the other sense capacitor. The digital word can be stored for later use.

Instead of using successive approximation logic of the kind described above, an alternative approach would be to simply sweep through all possible values of the digital word from 00000000 to 11111111 to identify the tripping point at which the value of the output of the sensor cell changes from logic zero to logic one or vice versa. The value of the digital word at the tripping point would again correspond to a time delay that can be used to determine the ratio of the sense capacitors and/or the absolute value of one of the sense capacitors (where the other sense capacitor is a reference capacitor) using equation 12.

FIG. 6 shows a sensor circuit in accordance with another embodiment of this invention. In this example, the circuit includes an array of sensor cells 110. Each sensor cell 110 may comprise a circuit of the kind described above in relation to FIGS. 1-4. The array may be provided with row control logic 90 for enabling the sensor cells 110 during a measurement and data read logic 100 for reading the output of each sensor cell 110. The data read logic 100 may further include a series of OR gates 102 for connecting the sensor cells 110 in each column to the data read logic 100. The arrangement of OR gates 102 can allow column-wise readout of the sensor cells, with each sensor cell 110 in each column being read out one at a time. To implement this, all the OR gates 102 in a column except the one that is connected to the sensor cell 110 being currently being read out can receive logic 0 signals at the inputs of the OR gates 102 connected to the outputs of the sensor cells 110. The cells that are not currently examined may thus each be disabled in such a way that their outputs have logic value 0. In this way, the chain of OR gates 102 is transparent to the value of the output of the sensor cell under examination in that column. In principal, this may mean that the arrangement in FIG. 6 can only be used to examine one sensor cell 110 per column simultaneously.

The circuit in this embodiment may further include a programmable delay generator 60 of the kind described above. The programmable delay generator 60 may provide CLK and CLKD signals to the array by signal lines 62, 64, respectively. Logic 80, such as successive approximation logic described above in relation to FIG. 5 can receive the output of the data read logic 100 by a signal line 72.

In this example, the operation of each individual sensor cell 110 is similar to that described above, as is the operation of the programmable delay generator 60 and the logic 80. The main difference between the example of FIG. 6 and the example of FIG. 5 is, of course, that in the example of FIG. 6, the circuit includes an array having a plurality of sensor cells. These sensor cells may be provided in, for example, intrusion detection circuitry of a secure integrated circuit or in any other kind of capacitance sensing application that requires the provision of a plurality of sense capacitors in an array.

In principle, readout of the capacitance from each sensor cell 110 in the array can involve determining a digital word for each individual sensor cell 110 in the array as enabled by the row control logic 90 and as read out by the data read logic 100. For faster readouts, it is envisaged that other methods may be used such as parallel reading of each row. In such examples, the delay provided by the programmable delay generator 60 may simply be swept from a minimal value to a maximum value and the tripping points of each sensor cell in each row may be recorded. As noted above, column-wise readout of the sensor cells may require examination of the tripping point of one cell per column per sweep.

Accordingly, there has been described a sensor circuit and method. The circuit includes a first subcircuit that includes a first sense capacitor, a first integration capacitor, and a first clock input for receiving a first digital clock signal for initiating discharge of the first integration capacitor at time T. The circuit includes a second subcircuit that includes a second sense capacitor, a second integration capacitor, and a second clock input for receiving a second digital clock signal for initiating discharge of the second integration capacitor at time $T+T_d$. A rate of discharge of the first and second integration capacitors is at least partly determined by a capacitance of the first and second sense capacitor, respectively. At time $T_{eval}$, after initiation of discharge of the first and second sense capacitors, the extent to which the first and second integration capacitors have discharged is compared. A digital signal indicating the result of the comparison is outputted.

Although particular embodiments of the invention have been described, it will be appreciated that many modifications/additions and/or substitutions may be made within the scope of the claimed invention.

The invention claimed is:

1. A sensor circuit comprising:
a first subcircuit comprising:
   a first sense capacitor;
   a first integration capacitor, and
   a first clock input for receiving a first digital clock signal for initiating discharge of the first integration capacitor at time T, wherein a rate of discharge of the first integration capacitor is at least partly determined by a capacitance of the first sense capacitor;
a second subcircuit comprising:
   a second sense capacitor;
   a second integration capacitor, and
   a second clock input for receiving a second digital clock signal for initiating discharge of the second integration capacitor at time $T+T_d$, wherein a rate of discharge of the second integration capacitor is at least partly determined by a capacitance of the second sense capacitor,
wherein the circuit is operable:
   at time $T_{eval}$, after initiation of discharge of the first and second integration capacitors, to compare the extent to which the first and second integration capacitors have discharged, thereby to compare the capacitance of the first sense capacitor to the capacitance of the second sense capacitor; and
   to output a digital signal indicating the result of the comparison,
   wherein the sensor circuit further comprises a delay generator for varying $T_d$ in a plurality of measurements for comparing the capacitance of the first sense capacitor to the capacitance of the second sense capacitor.

2. The sensor circuit of claim 1, wherein the first integration capacitor comprises a first decoupling capacitor connected to discharge through a first node of the first subcircuit, wherein the second integration capacitor comprises a second decoupling capacitor connected to discharge through a second node of the second subcircuit, and wherein the sensor circuit further comprises a latch having inputs connected to said nodes, wherein the latch is operable to set or reset according to the voltage at the first node compared to the voltage at the second node.

3. The sensor circuit of claim 2, wherein the latch comprises a pair of cross-coupled field effect transistors, wherein a first of said transistors has a gate connected to the first node and wherein a second of said transistors has a gate connected to the second node.

4. The sensor circuit of claim 1, wherein:
the first subcircuit further comprises a first inverter having an input for receiving the first digital clock signal and an output connected to the first sense capacitor, wherein the first integration capacitor is connected to a power supply input of the first inverter; and
the second subcircuit further comprises a second inverter having an input for receiving the second digital clock signal and an output connected to the second sense capacitor, wherein the second integration capacitor is connected to a power supply input of the second inverter.

5. The sensor circuit of claim 4, wherein the first inverter and the second inverter each include a transmission gate.

6. The sensor circuit of claim 1, wherein one of said first and second sense capacitors is a reference capacitor for sensing a reference capacitance to be compared to the capacitance of the other of said first and second sense capacitors.

7. The sensor circuit of claim 1, further comprising logic connected to receive the digital signal indicating the result of said comparison from said output, wherein the logic is operable to:
control the delay generator for varying $T_d$ in a plurality of measurements for comparing the capacitance of the first sense capacitor to the capacitance of the second sense capacitor, and
to convert the results of the measurements into a digital word.

8. The sensor circuit of claim 7, wherein said logic comprises successive approximation logic.

9. A sensor array comprising a plurality of sensor circuits according to claim 1.

10. A secure integrated circuit comprising the sensor array of claim 9, wherein the sensor circuits are operable to detect a change in capacitance in their sense capacitors associated with a tampering of the integrated circuit.

11. A method for comparing the capacitance of a first sense capacitor to the capacitance of a second sense capacitor of a sensor circuit, the method comprising:
using a first digital clock signal to initiate, at time T, discharge of a first integration capacitor, wherein a rate of discharge of the first integration capacitor is at least partly determined by the capacitance of the first sense capacitor;
using a second digital clock signal to initiate, at time $T+T_d$, discharge of a second integration capacitor, wherein a rate of discharge of the second integration capacitor is at least partly determined by the capacitance of the second sense capacitor;
at time $T_{eval}$, after initiation of discharge of the first and second integration capacitors, comparing the extent to which the first and second integration capacitors have discharged, thereby to compare the capacitance of the first sense capacitor to the capacitance of the second sense capacitor; and
outputting a digital signal indicating the result of the comparison, wherein the method further comprises performing a plurality of measurements by repeating the steps of:
initiating discharge of the first integration capacitor;
initiating discharge of the second integration capacitor, and
comparing the extent to which the first and second integration capacitors have discharged,
for a plurality of values of $T_d$, to evaluate the capacitance of the first and/or the second capacitor.

12. The method of claim 11, wherein the outputted digital signal is indicative of which of the first sense capacitor and the second sense capacitor has the largest capacitance.

13. The method of claim 11, comprising converting the results of the plurality of measurements into a digital word.

14. A sensor circuit comprising:
a first subcircuit comprising:
a first sense capacitor;
a first integration capacitor, and
a first clock input for receiving a first digital clock signal for initiating discharge of the first integration capacitor at time T, wherein a rate of discharge of the first integration capacitor is at least partly determined by a capacitance of the first sense capacitor;
a second subcircuit comprising:
a second sense capacitor;
a second integration capacitor, and
a second clock input for receiving a second digital clock signal for initiating discharge of the second integration capacitor at time $T+T_d$, wherein a rate of discharge of the second integration capacitor is at least partly determined by a capacitance of the second sense capacitor,
wherein the circuit is operable:
at time $T_{eval}$, after initiation of discharge of the first and second integration capacitors, to compare the extent to which the first and second integration capacitors have discharged, thereby to compare the capacitance of the first sense capacitor to the capacitance of the second sense capacitor; and
to output a digital signal indicating the result of the comparison, wherein:
the first subcircuit further comprises a first inverter having an input for receiving the first digital clock signal and an output connected to the first sense capacitor, wherein the first integration capacitor is connected to a power supply input of the first inverter, and
the second subcircuit further comprises a second inverter having an input for receiving the second digital clock signal and an output connected to the second sense capacitor, wherein the second integration capacitor is connected to a power supply input of the second inverter.

15. The sensor circuit of claim 14, wherein the first integration capacitor comprises a first decoupling capacitor connected to discharge through a first node of the first subcircuit, wherein the second integration capacitor comprises a second decoupling capacitor connected to discharge through a second node of the second subcircuit, and wherein the sensor circuit further comprises a latch having inputs connected to said nodes, wherein the latch is operable to set or reset according to the voltage at the first node compared to the voltage at the second node.

16. The sensor circuit of claim 15, wherein the latch comprises a pair of cross-coupled field effect transistors, wherein a first of said transistors has a gate connected to the first node and wherein a second of said transistors has a gate connected to the second node.

17. The sensor circuit of claim 14, wherein the first inverter and the second inverter each include a transmission gate.

18. The sensor circuit of claim 14, wherein one of said first and second sense capacitors is a reference capacitor for sensing a reference capacitance to be compared to the capacitance of the other of said first and second sense capacitors.

19. The sensor circuit of claim 14, further comprising a delay generator for varying $T_d$ in a plurality of measurements for comparing the capacitance of the first sense capacitor to the capacitance of the second sense capacitor.

20. The sensor circuit of claim 19, further comprising logic connected to receive the digital signal indicating the result of said comparison from said output, wherein the logic is operable to:
  control the delay generator for varying $T_d$ in a plurality of measurements for comparing the capacitance of the first sense capacitor to the capacitance of the second sense capacitor, and
  to convert the results of the measurements into a digital word.

* * * * *